(12) United States Patent
Yamaguchi et al.

(10) Patent No.: US 9,057,745 B2
(45) Date of Patent: Jun. 16, 2015

(54) MEASUREMENT APPARATUS AND ELECTRONIC DEVICE

(71) Applicants: ADVANTEST CORPORATION, Tokyo (JP); The University of Tokyo, Tokyo (JP)

(72) Inventors: Takahiro Yamaguchi, Saitama (JP); Satoshi Komatsu, Tokyo (JP); Kunihiro Asada, Tokyo (JP); James Sumit Tandon, Tokyo (JP)

(73) Assignees: ADVANTEST CORPORATION, Tokyo (JP); The University of Tokyo, Tokyo (JP)

( * ) Notice: Subject to any disclaimer, the term of this patent is extended or adjusted under 35 U.S.C. 154(b) by 335 days.

(21) Appl. No.: 13/746,313

(22) Filed: Jan. 22, 2013

(65) Prior Publication Data

US 2014/0184194 A1 Jul. 3, 2014

(30) Foreign Application Priority Data

Dec. 28, 2012 (JP) ................................. 2012-288653

(51) Int. Cl.
*G01R 19/00* (2006.01)
*G01R 29/00* (2006.01)

(52) U.S. Cl.
CPC ...................................... *G01R 29/00* (2013.01)

(58) Field of Classification Search
CPC ..... G01R 29/00; G01R 31/2894; H01L 22/34; H01L 2924/0002
USPC ........................................................ 324/76.11
See application file for complete search history.

(56) References Cited

U.S. PATENT DOCUMENTS

| 3,903,470 | A | * | 9/1975 | Mirabile et al. | ............ 324/76.16 |
| 4,352,094 | A | * | 9/1982 | Reneric | ............................ 341/118 |
| 5,748,036 | A | * | 5/1998 | Lee et al. | ........................ 329/300 |
| 2005/0163272 | A1 | * | 7/2005 | Payne et al. | .................... 375/354 |
| 2012/0320480 | A1 | * | 12/2012 | Lisart et al. | ...................... 361/88 |
| 2014/0062751 | A1 | * | 3/2014 | Gopinathan et al. | ........... 341/158 |
| 2014/0188436 | A1 | * | 7/2014 | Yamaguchi et al. | ........... 702/189 |
| 2014/0197846 | A1 | * | 7/2014 | Yamaguchi et al. | ........... 324/606 |

FOREIGN PATENT DOCUMENTS

JP 2012-227930 A 11/2012

* cited by examiner

*Primary Examiner* — Benjamin M Baldridge

(57) ABSTRACT

Provided is a measurement apparatus that measures an input signal, comprising a plurality of first comparators that each receive the input signal, have a common first reference level set therein, and compare a signal level of the input signal to the first reference level; and a level-crossing timing detecting section that detects a level-crossing timing at which the signal level crosses the first reference level, based on comparison results of the first comparators.

8 Claims, 11 Drawing Sheets

MEASUREMENT APPARATUS AND ELECTRONIC DEVICE

BACKGROUND

1. Technical Field

The present invention relates to a measurement apparatus and a electronic device.

2. Related Art

As a conventional measurement apparatus for measuring an input signal, an apparatus is known that includes comparators. For example, a flash AD converter is known that converts the input signal waveform into a discrete signal waveform by using a plurality of comparators that each have a different reference level set therein, as shown in Patent Document 1, for example.

Patent Document 1: Japanese Patent Application Publication No. 2012-227930

However, the conventional measurement apparatus measures the magnitude relationship between the signal level of the input signal and a prescribed reference signal level by using the 1-bit information output by the comparators into which the reference level is provided. Therefore, when edges with a large slew rate are input, sampling errors are likely to occur. Furthermore, the effect of signal noise or the like on the measurement result is increased, thereby degrading the measurement accuracy.

SUMMARY

Therefore, it is an object of an aspect of the innovations herein to provide a measurement apparatus and a electronic device, which are capable of overcoming the above drawbacks accompanying the related art. The above and other objects can be achieved by combinations described in the claims. According to a first aspect of the present invention, provided is a measurement apparatus that measures an input signal, comprising a plurality of first comparators that each receive the input signal, have a common first reference level set therein, and compare a signal level of the input signal to the first reference level; and a level-crossing timing detecting section that detects a level-crossing timing at which the signal level crosses the first reference level, based on comparison results of the first comparators.

According to a second aspect of the present invention, provided is an electronic device comprising the measurement apparatus of the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
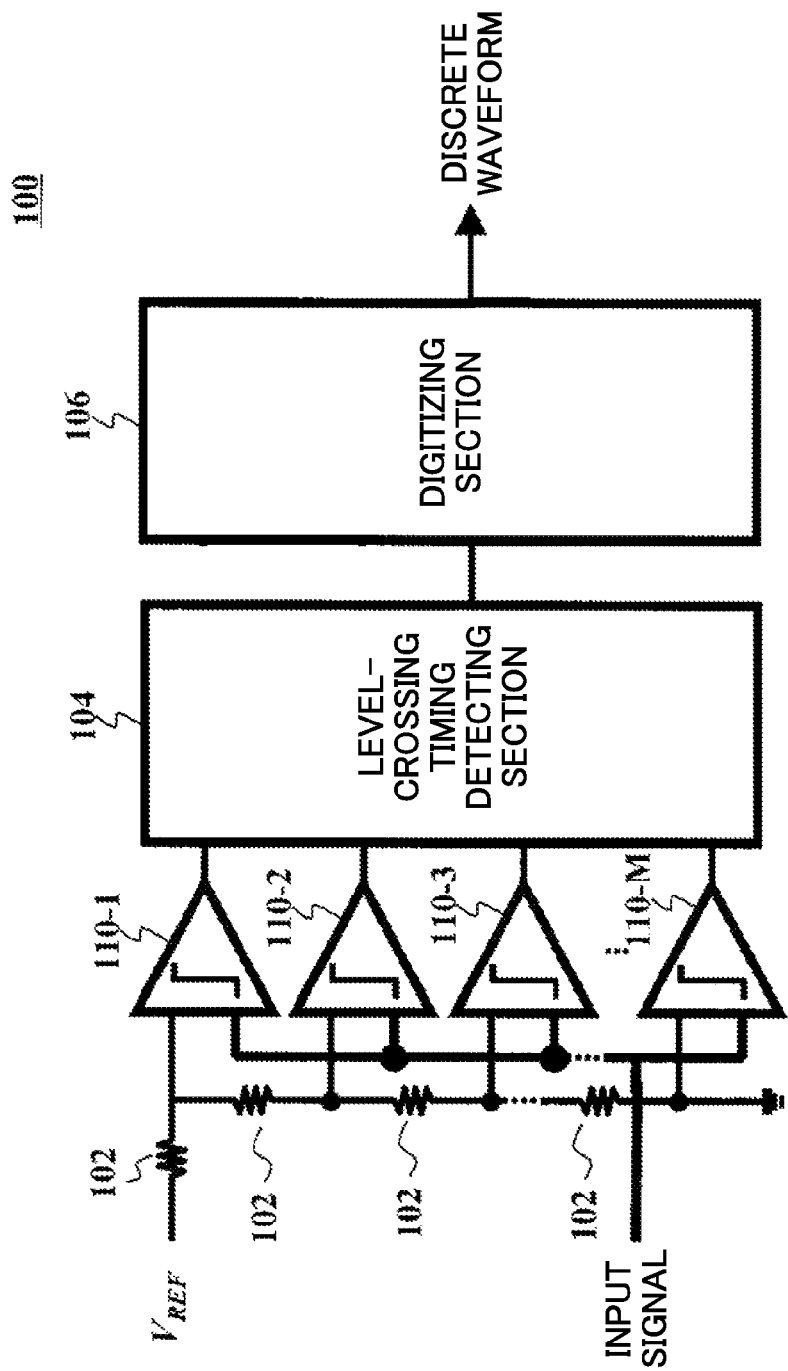
FIG. 1 shows an exemplary configuration of a measurement apparatus 100 that measures an input signal.

FIG. 1 shows an exemplary configuration of a measurement apparatus 100 that measures an input signal. The measurement apparatus 100 of the present embodiment is an AD converter that digitizes the waveform of the input signal. The measurement apparatus 100 includes a plurality of voltage dividing resistors 102, a plurality of stochastic samplers 110-1 to 110-M (sometimes referred to collectively as the stochastic samplers 110), a level-crossing timing detecting section 104, and a digitizing section 106.

The voltage dividing resistors 102 are connected in series and a predetermined voltage $V_{REF}$ and ground potential are applied to the respective ends of this serial connection. By dividing the voltage $V_{REF}$, the voltage dividing resistors 102 generate a different reference level for each of the stochastic samplers 110. The resistance value of each voltage dividing resistor 102 may be the same.

Each stochastic sampler 110 receives the corresponding reference level and a common input signal. Each stochastic sampler 110 outputs information corresponding to the magnitude relationship between the corresponding reference level and the signal level of the input signal. More specifically, each stochastic sampler 110 includes a plurality of comparators, and outputs information obtained by combining the plurality of comparison results obtained from the comparators comparing the input signal to the reference level.

The level-crossing timing detecting section 104 detects the level-crossing timings at which the signal level of the input signal crosses each of the reference levels set in the respective stochastic samplers 110, based on the information output by the stochastic samplers 110.

The digitizing section 106 digitizes the waveform of the input signal based on the reference level values set in each of the stochastic samplers 110 and the level-crossing timings detected by the level-crossing timing detecting section 104 for each reference level. The digitizing section 106 may output a data sequence in which the reference level values are associated with the level-crossing timings. The level-crossing timing detecting section 104 may further include the function of the digitizing section 106 therein.

Figure 2:
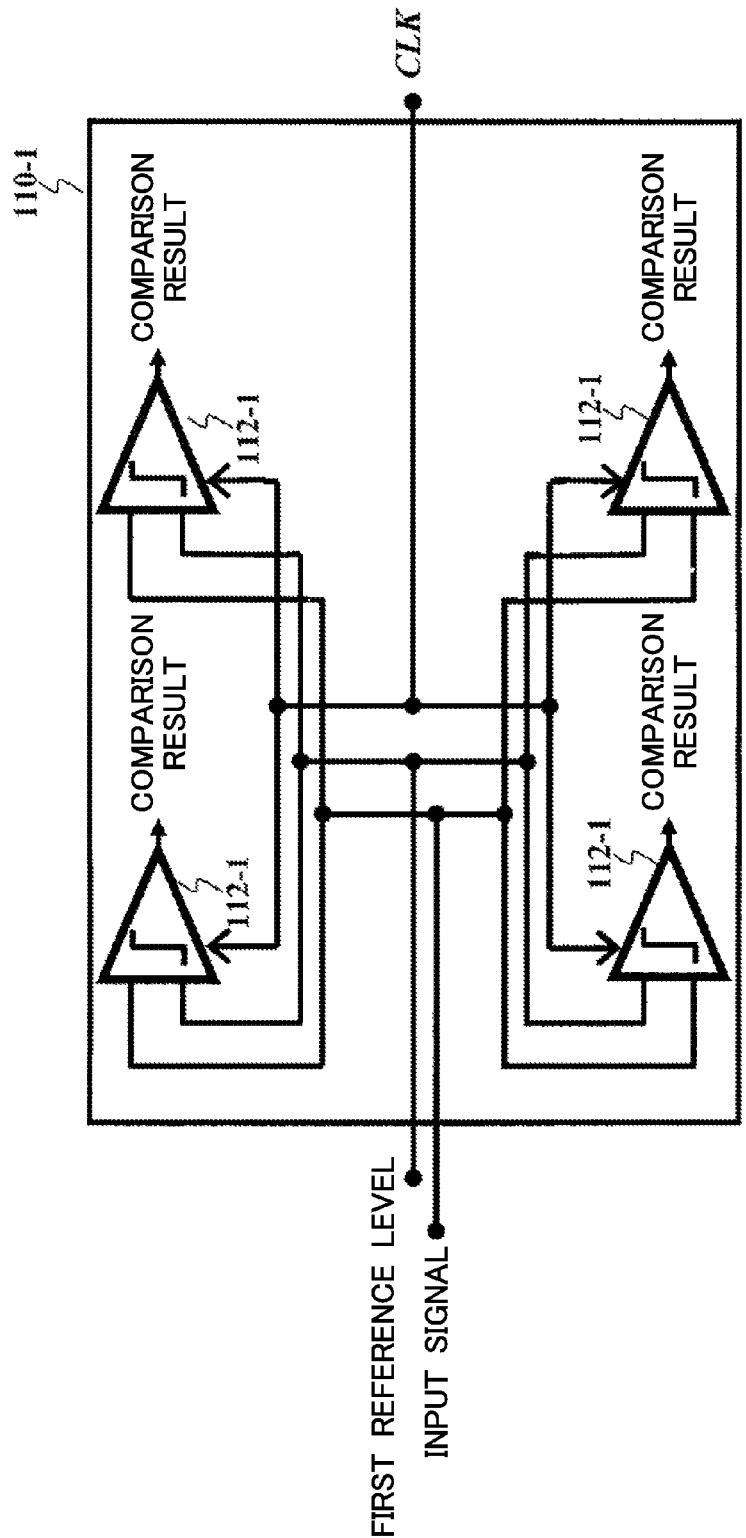
FIG. 2 shows an exemplary configuration of a first stochastic sampler 110-1.

FIG. 2 shows an exemplary configuration of a first stochastic sampler 110-1. The first stochastic sampler 110-1 includes a plurality of first comparators 112-1. The first comparators 112-1 each receive the common input signal and each have a common first reference level set therein. FIG. 2 shows an example in which there are four first comparators 112-1, but the first stochastic sampler 110-1 may include more first comparators 112-1. For example, the first stochastic sampler 110-1 may include 63 first comparators 112-1.

Each first comparator 112-1 compares the signal level of the input signal to the first reference level. More specifically, each first comparator 112-1 outputs, as a comparison result, a logic value indicating the magnitude relationship between the first reference level and the signal level of the input signal. For example, the first comparators 112-1 may each output a logic value of 1 when the signal level of the input signal is greater than or equal to the first reference level and output a logic value of 0 when the signal level of the input signal is less than the first reference level.

The first stochastic sampler 110-1 may output a combination of the comparison results output by the first comparators 112-1. For example, the first stochastic sampler 110-1 may output the number of comparison results that indicate a prescribed logic value or the ratio of comparison results that indicate a prescribed logic value, from among the comparison results output by the first comparators 112-1. As another example, the first stochastic sampler 110-1 may output the comparison results of the first comparators 112-1 without alteration.

The first comparators 112-1 in the present embodiment are clocked comparators. The first stochastic sampler 110-1 receives a clock CLK from a terminal provided in common to the first comparators 112-1, and distributes the clock CLK to the first comparators 112-1 using equal-length wires, such as in an H tree. The frequency of the input clock CLK is preferably sufficiently higher than the frequency of the input signal. It should be noted that, if the frequency of the clock CLK can be set coherently with respect to the frequency of the input signal, the frequency of the clock CLK may be low. Furthermore, the first stochastic sampler 110-1 receives the input signal from a terminal provided in common to the first comparators 112-1, and distributes the input signal to the first comparators 112-1 using equal-length wires, such as in an H tree.

The level-crossing timing detecting section 104 shown in FIG. 1 detects the level-crossing timing at which the input signal crosses the first reference level, based on the comparison results of the first comparators 112-1. For example, the level-crossing timing detecting section 104 may detect, as the level-crossing timing at which the input signal crosses the first reference level, a timing at which half of the comparison results of the first comparators 112-1 indicate a logic value of 1.

The other stochastic samplers 110 have the same configuration as the first stochastic sampler 110-1. For example, the second stochastic sampler 110-2 includes second comparators 112 that each receive the input signal, have a common second reference level set therein, and compare the signal level of the input signal to the second reference level. The level-crossing timing detecting section 104 detects the level-crossing timing at which the input signal crosses the second reference level, based on the comparison results of the second comparators 112. The level-crossing timing detecting section 104 detects the level-crossing timing of the input signal in the same manner for each of the other reference levels. Furthermore, in the present specification, the number of comparators 112 included in a single stochastic sampler 110 is N.

Figure 3:
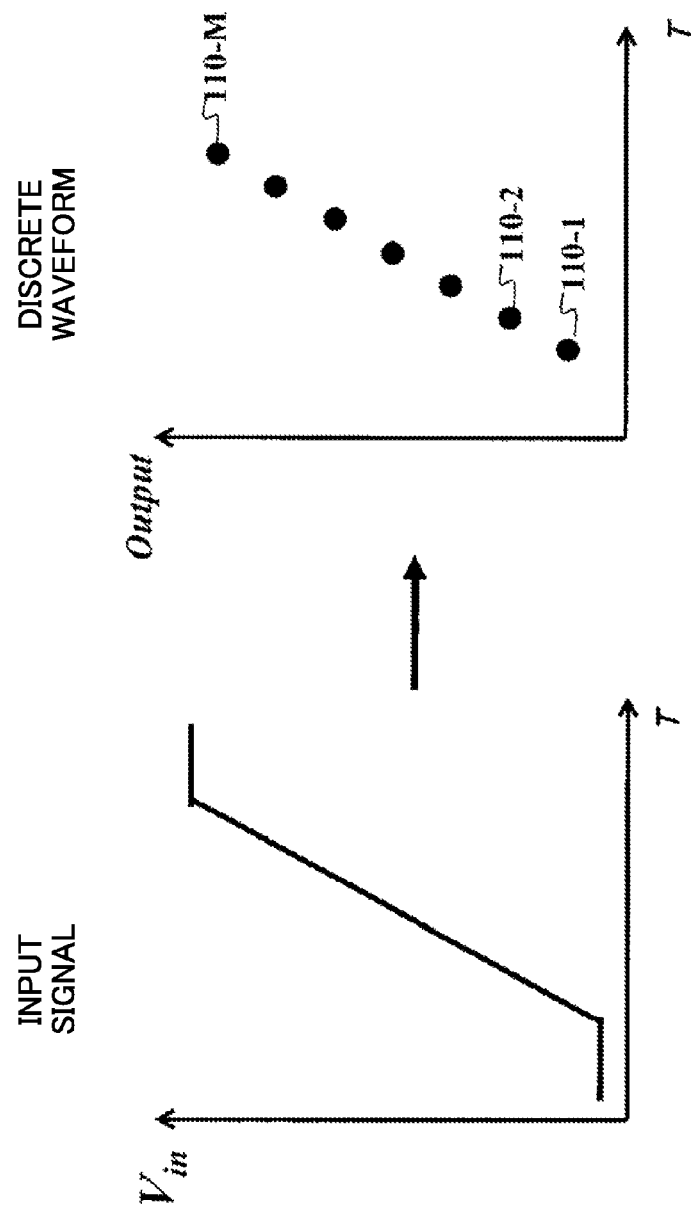
FIG. 3 shows an exemplary input signal input to the measurement apparatus 100 and an exemplary digitized waveform output by the measurement apparatus 100.

FIG. 3 shows an exemplary input signal input to the measurement apparatus 100 and an exemplary discrete waveform output by the measurement apparatus 100. The input signal is input to the plurality of stochastic samplers 110, and the level-crossing timing detecting section 104 detects the level-crossing timing for each reference level. The digitizing section 106 outputs discrete waveform data in which each reference level value is associated with a level-crossing timing. When the discrete waveform data is plotted in a coordinate plane where the horizontal axis represents time and the vertical axis represents the digital value, a discrete waveform such as shown in FIG. 3 is obtained.

Figure 4:
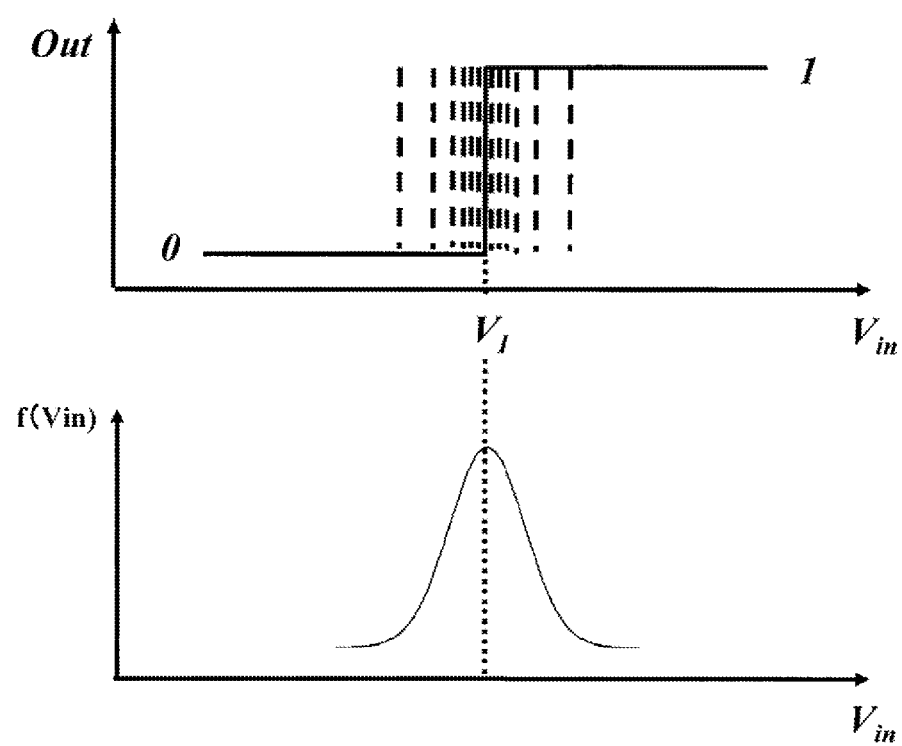
FIG. 4 is used to describe variation in the characteristics of the comparators 112 within a stochastic sampler 110.

FIG. 4 is used to describe variation in the characteristics of the comparators 112 within a stochastic sampler 110. In the upper portion of FIG. 4, the horizontal axis represents the signal level of the input signal and the vertical axis represents the logic values output by the comparators 112. In a case where the comparators 112 are ideal, the logic values of all of the comparators 112 transition when the signal level of the input signal crosses the voltage $V_1$ corresponding to the reference level. However, due to variation in the characteristics of the comparators 112, for example, there is a skew (offset) between the signal levels of the signal under measurement at which the logic values transition.

In the lower portion of FIG. 4, the horizontal axis represents the signal level of the input signal and the vertical axis represents the probability density $f(V_{in})$ that the logic value output by a comparator 112 will transition. Here, $f(V_{in})$ indicates the ratio of comparators 112 whose logic values transition when the signal level of the input signal is $V_{in}$, from among the plurality of comparators 112. Usually, the distribution of the offsets of the comparators 112 is Gaussian, as shown in FIG. 4.

Figure 5:
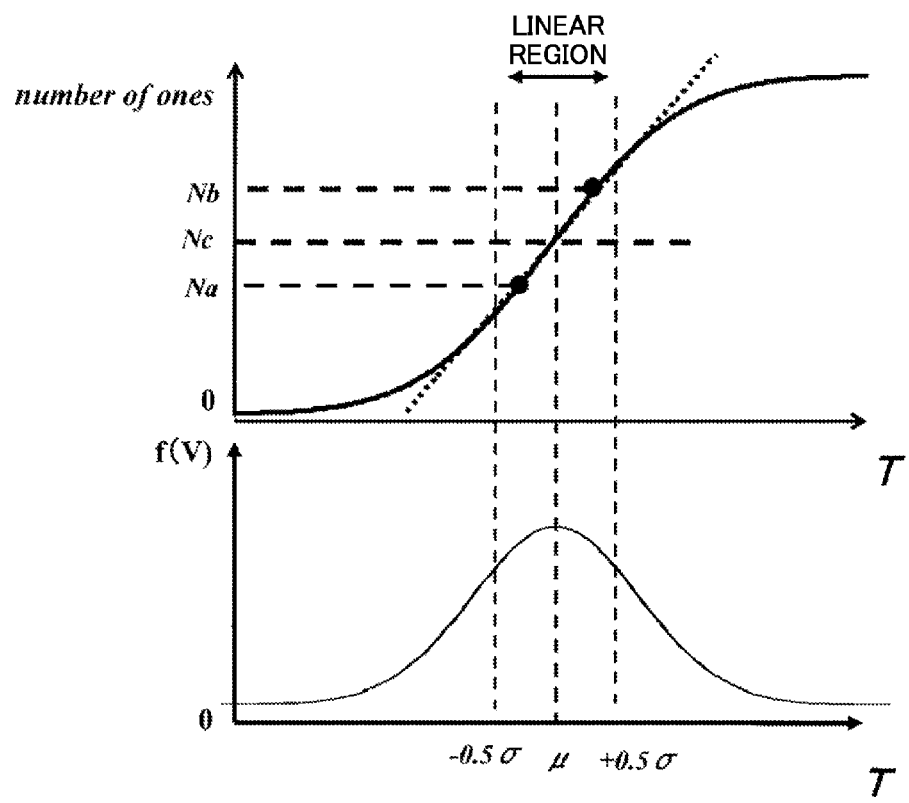
FIG. 5 is used to describe operation of the stochastic sampler 110 when an input signal whose signal level gradually increases over time is input to the stochastic sampler 110.

FIG. 5 is used to describe operation of the stochastic sampler 110 when an input signal whose signal level gradually increases over time is input to the stochastic sampler 110. In FIG. 5, the horizontal axis represents time. The vertical axis in the upper portion of FIG. 5 represents the number of logic values of 1 output by the stochastic sampler 110, and the vertical axis in the lower portion of FIG. 5 represents the probability density function of the timings at which the logic values output by the comparators 112 transition. Furthermore, the probability density function in the lower portion of FIG. 5 is a Gaussian distribution having a standard deviation that corresponds to the slope of the signal-level change in the input signal.

When an input signal whose signal level gradually increases is input to the stochastic sampler 110, as shown in the upper portion of FIG. 5, the ratio (number) of comparison results indicating a logic value of 1 gradually changes from 0% (0 results) to 100% (N results). The level-crossing timing detecting section 104 calculates the timing at which the ratio of comparison results indicating a prescribed logic value, e.g. a logic value of 1, from among the comparison results of the comparators 112, is a predetermined reference ratio (Nc/N). For example, this reference ratio may be 50%. The level-crossing timing detecting section 104 may detect the timing at which the number of comparison results indicating the prescribed logic value, from among the comparison results of the comparators 112, is a predetermined number Nc. This predetermined number Nc may be N/2, for example.

In this way, by setting the same reference level for the comparators 112 and using the characteristic variation occurring in the comparators 112, the level-crossing timing can be detected as an average value of the probability density function. As a result, the chance of incorrectly detecting the level-crossing timing for edges with large slew rates can be made small, thereby realizing accurate measurement.

The relationship shown in the upper portion of FIG. 5 is equivalent to the integral of the probability density function shown in the lower portion of FIG. 5. As described above, since the probability density function is a Gaussian distribution, the change in the probability density near the average value of the distribution is relatively low. Therefore, in the upper portion of FIG. 5, near the average value of the probability density function, there is a linear region in which the change in the number of comparison results indicating a logic value of 1 increases linearly.

The level-crossing timing detecting section 104 may calculate the timing of the above reference ratio (Nc/N) by performing an interpolation between two pieces of data within the linear region shown in the upper portion of FIG. 5. The timings of these two pieces of data preferably sandwich the timing of the above reference ratio (Nc/N). In other words, the ratios Na and Nb of these two pieces of data preferably sandwich the above reference ratio (Nc/N). The linear region may be a range of $\pm 0.5\sigma$ or $\pm \sigma$ centered on the average value $\mu$ in the probability density function. As another example, the linear range may be a range of $\pm 0.5\sigma$ or $\pm \sigma$ centered on the timing at which the ratio of comparison results indicating a prescribed logic value, e.g. a logic value of 1, is 50%, from among the comparison results of the comparators 112.

The level-crossing timing detecting section 104 may set a linear region with a different range for each stochastic sampler 110, i.e. for each reference level. For example, the level-crossing timing detecting section 104 may set a wider linear region for a stochastic sampler 110 in which the slope of the input signal is greater at the corresponding reference level. The measurement apparatus 100 may measure the slope of the input signal at each of the reference levels. The level-crossing timing detecting section 104 may set the range of the linear region in each stochastic sampler 110 according to the slope of the input signal at the corresponding reference level.

For example, when the input signal is a sine wave, the level-crossing timing detecting section 104 may set a linear region with a minimum range for stochastic samplers 110 in which the reference level is a minimum value or a maximum level, which correspond to the 0% level (minimum signal level) and 100% level (maximum signal level) of the input signal. The level-crossing timing detecting section 104 may set a linear region with a maximum range for the stochastic sampler 110 in which the reference level is the central value, which corresponds to a 50% level of the input signal. In this way, a suitable linear region can be selected for each stochastic sampler 110 according to the input signal, thereby minimizing the incorrect detection rate. As a result, the level-crossing timing at which the input signal crosses each reference level can be more accurately detected.

Figure 6:
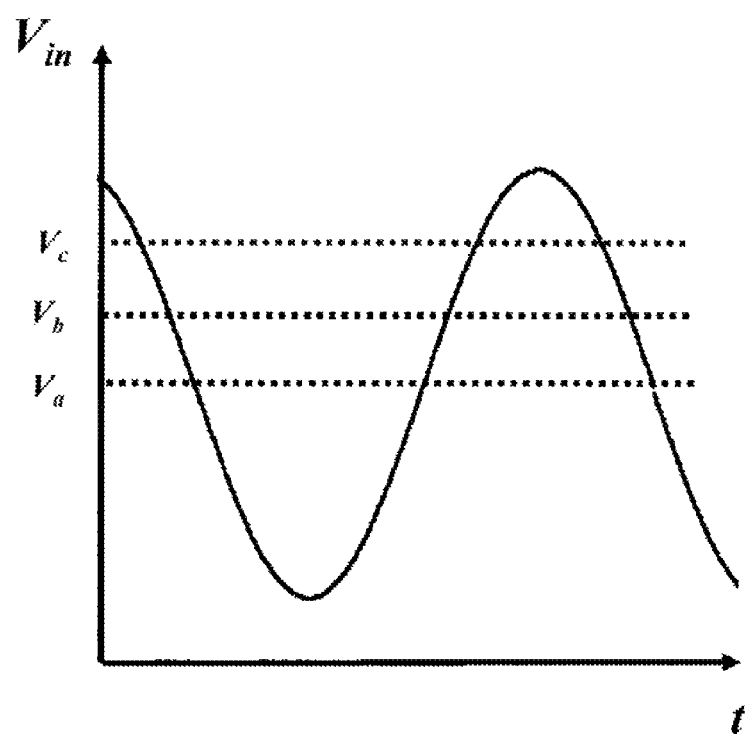
FIG. 6 shows an exemplary relationship between the input signal and a plurality of reference levels. In this example, the input signal is a sine wave.
Figure 7:
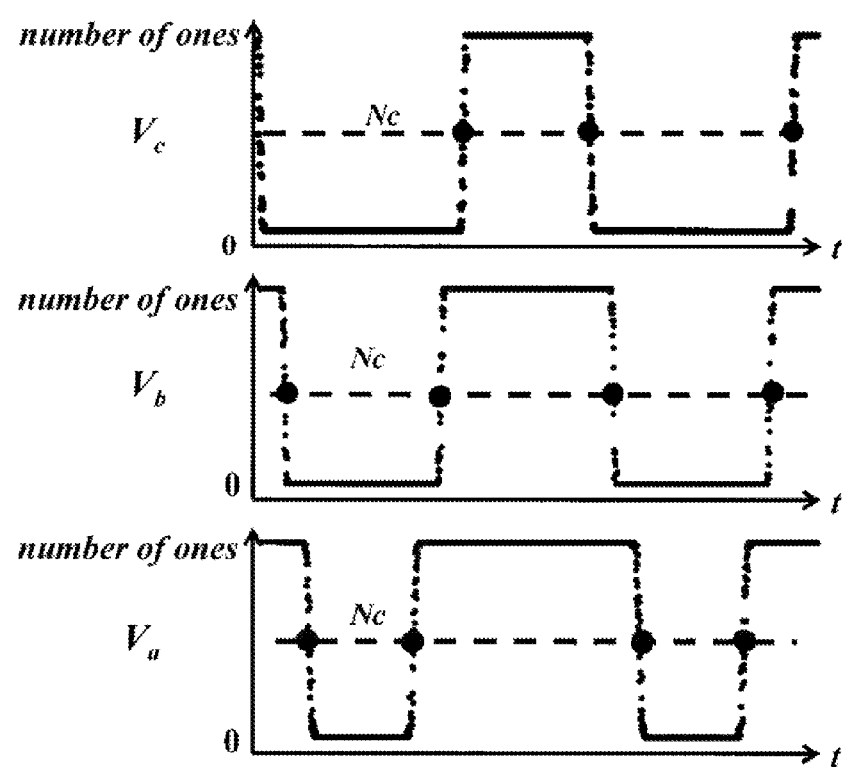
FIG. 7 shows an exemplary operation of a plurality of stochastic samplers 110 in which are set the reference levels shown in FIG. 6.

FIG. 6 shows an exemplary relationship between the input signal and a plurality of reference levels. In this example, the input signal is a sine wave. FIG. 7 shows an exemplary operation of a plurality of stochastic samplers 110 in which are set the reference levels shown in FIG. 6. In FIG. 7, the horizontal axis represents time and the vertical axis represents the number of comparators 112 that output a logic value of 1.

As shown in FIG. 7, the number of logic values of 1 output by each stochastic sampler 110 is 0 when the signal level of the input signal is sufficiently smaller than the reference level. Furthermore, the number of logic values of 1 output by each stochastic sampler 110 is N when the signal level of the input signal is sufficiently larger than the reference level. The number of logic values of 1 output by each stochastic sampler 110 changes between 0 and N as the signal level of the input signal approaches the reference level. The level-crossing timing detecting section 104 detects the timing at which the number of logic values of 1 output by each stochastic sampler 110 is half (Nc=N/2) the number of comparators 112 included in the stochastic sampler 110.

Figure 8:
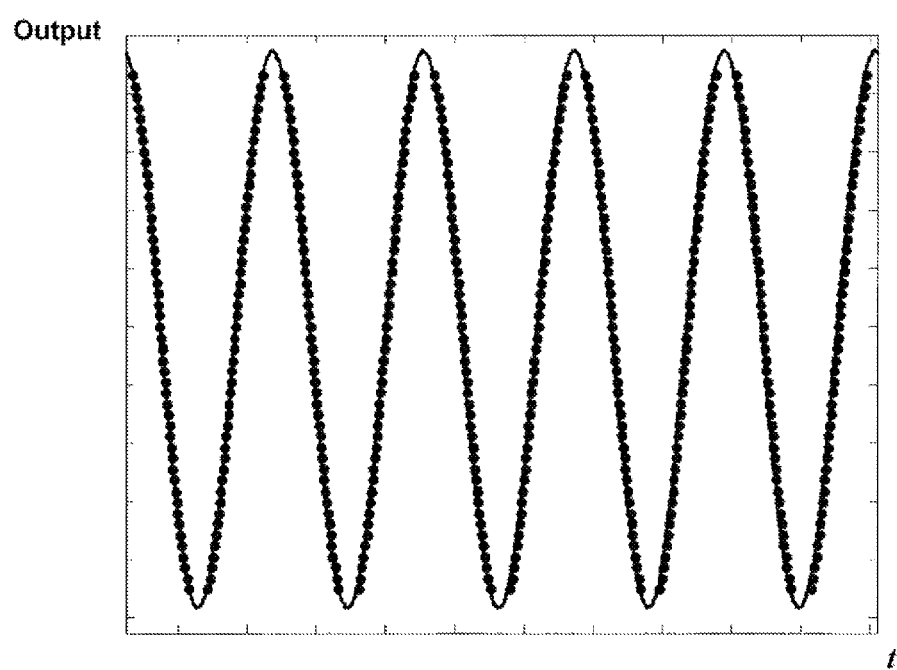
FIG. 8 shows an exemplary discrete waveform obtained by plotting each reference level and level-crossing timing.

FIG. 8 shows an exemplary discrete waveform obtained by plotting each reference level and level-crossing timing. FIGS. 6 and 7 show an example in which there are three reference levels, but in the example of FIG. 8, the discrete waveform is plotted using many more than three reference levels. As shown in FIG. 8, by plotting each reference level at the corresponding level-crossing timing detected by the level-crossing timing detecting section 104, the discrete waveform of the input signal can be obtained.

Figure 9:
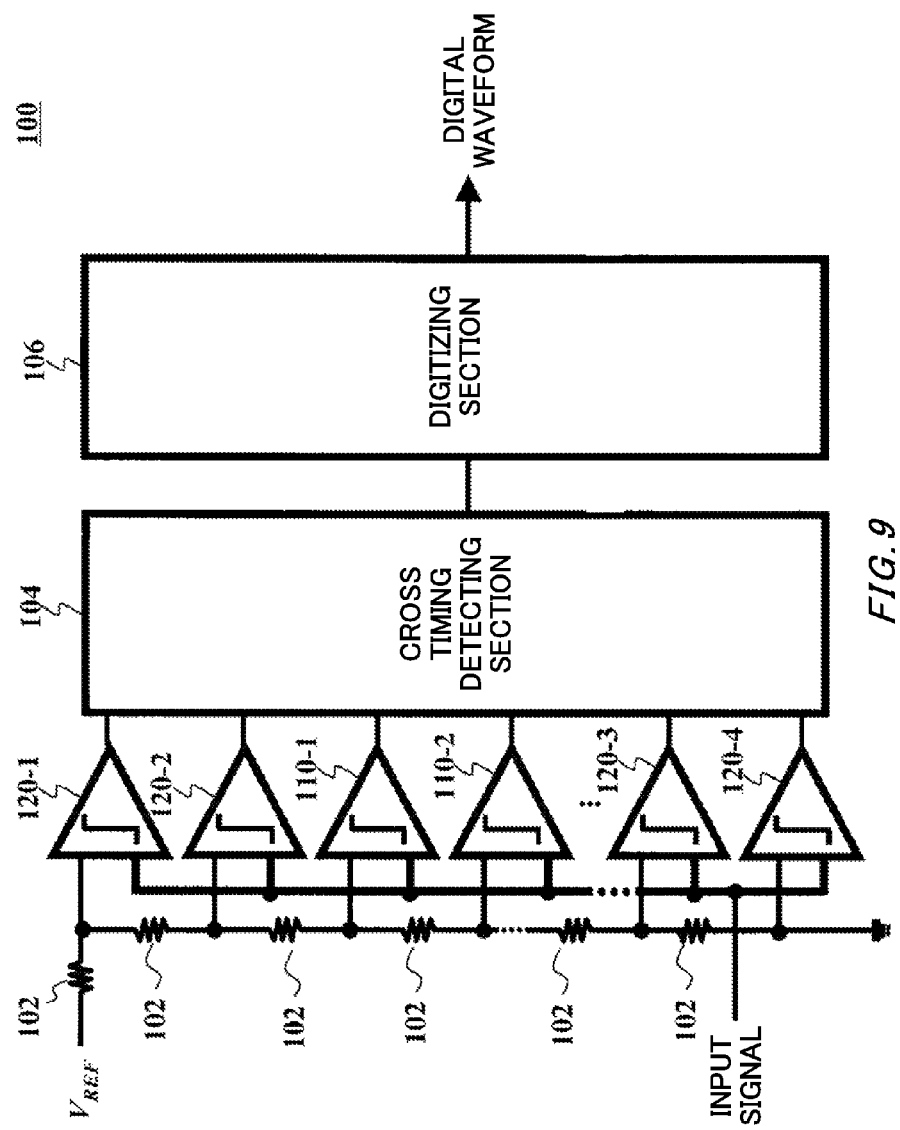
FIG. 9 shows another exemplary configuration of the measurement apparatus 100.

FIG. 9 shows another exemplary configuration of the measurement apparatus 100. The measurement apparatus 100 of the present embodiment further includes a plurality of third comparators 120 in addition to the configuration of the measurement apparatus 100 shown in FIG. 1. The third comparators 120 have the same function as the comparators 112. The measurement apparatus 100 may include a plurality of groups of third comparators 120. Each group functions as a voltage sampler. For example, each voltage sample may function as a flash AD converter. In other words, different reference levels are set for the third comparators 120 in each voltage sampler. The level-crossing timing detecting section 104 detects the signal level of the input signal and converts the signal level into a digital value, based on the output of each third comparator 120.

In the embodiment of FIG. 9, the first voltage sampler includes third comparators 120-1 and 120-2. The second voltage sampler includes third comparators 120-3 and 120-4. The number of third comparators 120 in each voltage sampler may be less than the number of comparators 112 in the stochastic sampler 110. In the present embodiment, each voltage sampler includes two third comparators 120. The measurement apparatus 100 need only include one of the voltage samplers.

A reference level that is near the 100% level (maximum signal level) of the input signal is set in each third comparator 120 of the first voltage sampler. In other words, the first voltage sampler compares the signal level of the input signal to a reference level that is greater than the reference levels set in the stochastic samplers 110.

Each third comparator 120 in the first voltage sampler is set to have a reference level that is greater than each reference level set in a stochastic sampler 110, and the reference levels set for each third comparator 120 in the first voltage sampler are different from each other. For example, the third comparator 120-1 may be set to have the maximum reference level (near the 100% level of the input signal) from among the reference levels generated by the voltage dividing resistor 102, and the third comparator 120-2 may be set to have the second highest reference level.

A reference level that is near the minimum signal level of the input signal is set in each third comparator 120 of the second voltage sampler. In other words, the second voltage sampler compares the signal level of the input signal to a reference level that is less than the reference levels set in the stochastic samplers 110.

Each third comparator 120 in the second voltage sampler is set to have a reference level that is less than each reference level set in a stochastic sampler 110, and the reference levels set for each third comparator 120 in the second voltage sampler are different from each other. For example, the third comparator 120-4 may be set to have the minimum reference level (near the 0% level of the input signal) from among the reference levels generated by the voltage dividing resistor 102, and the third comparator 120-3 may be set to have the second lowest reference level.

The stochastic sampler 110 detects the level-crossing timing for one reference level by using a plurality of comparators 112, and can therefore detect the level-crossing timing with a high degree of precision. On the other hand, the voltage samplers use one comparator for each reference level. Therefore, the detection precision for the signal level is less than that of the stochastic sampler 110. However, when the input signal is a sine wave or the like, the slope of the input signal is relatively small near the maximum and minimum reference levels, and therefore the detection precision barely decreases even when only one third comparator 120 is allocated to each reference level. In other words, the accurate detection of the level-crossing timing can be maintained while realizing a smaller circuit.

Figure 10A:
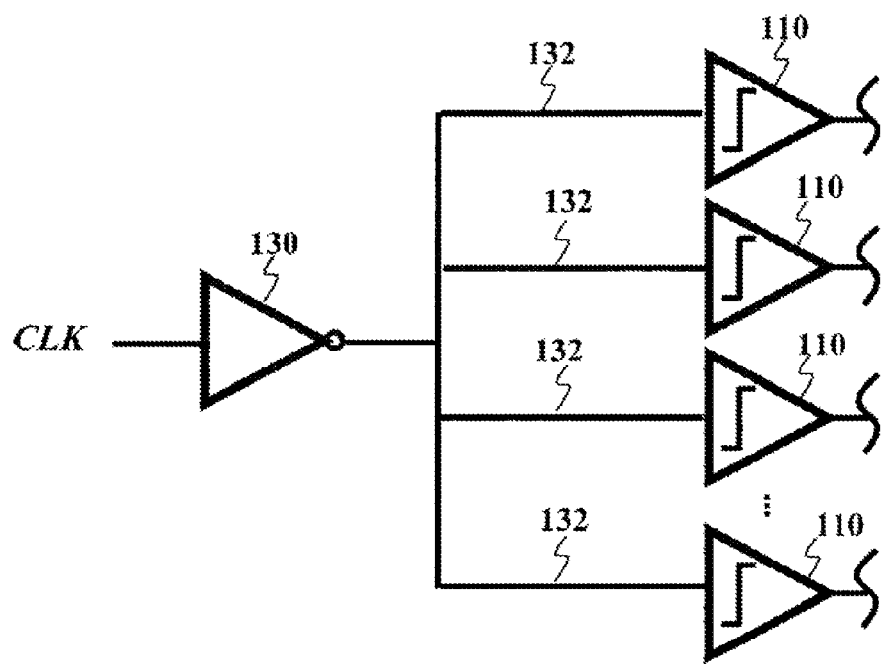
FIG. 10A shows an exemplary configuration of a distribution circuit that distributes the clock to the stochastic samplers 110.

FIG. 10A shows an exemplary configuration of a distribution circuit that distributes the clock to the stochastic samplers 110. The distribution circuit includes a buffer 130 and a plurality of transmission paths 132. The buffer 130 is provided in common to the plurality of stochastic samplers 110, shapes a clock received from the outside, and outputs the resulting clock.

The transmission paths 132 are provided to correspond one-to-one with the plurality of stochastic samplers 110. Each transmission path 132 transmits the clock output by the buffer 130 to the corresponding stochastic sampler 110. In the present embodiment, the propagation delay from the buffer 130 to each stochastic sampler 110 is the same. For example, the transmission paths 132 are all of the same length. With this configuration, the clock arrives at each stochastic sampler 110 at approximately the same time.

Figure 10B:
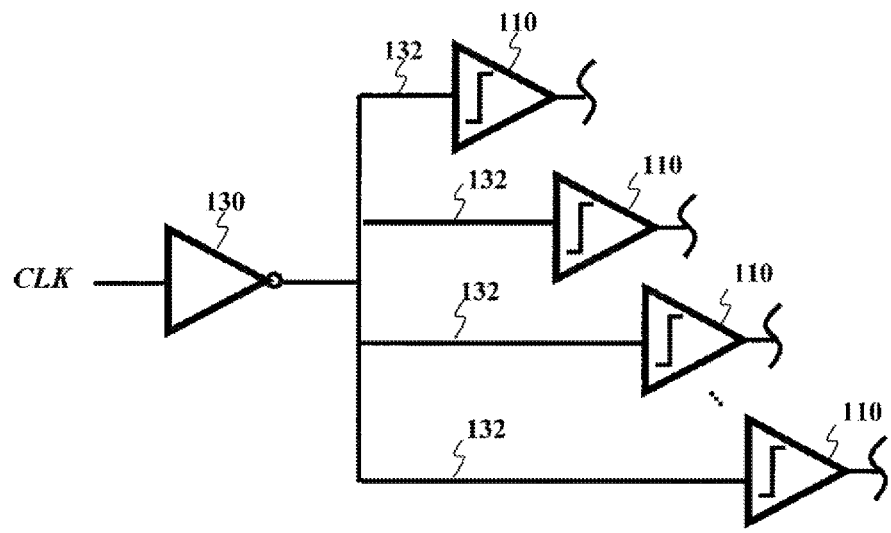
FIG. 10B shows another exemplary configuration of the distribution circuit.

FIG. 10B shows another exemplary configuration of the distribution circuit. In the present embodiment, the transmission delay from the buffer 130 to each stochastic sampler 110 is different. For example, the transmission paths 132 may have different electrical lengths. With this configuration, the clock arrives at each stochastic sampler 110 at a different timing. With this configuration as well, the discrete waveform of the input signal can be acquired. The clock is distributed to each stochastic sampler 110 through equal-length wires, and the input signal may be distributed through wires of different electrical length.

In the exemplary configuration shown in FIG. 2, the clock is distributed to the comparators 112 in one stochastic sampler 110 through wires of equal length. As another example, the clock may be distributed to the comparators 112 through wires of unequal length. By creating a skew between the clocks supplied to the comparators 112, the distribution range of the probability density shown in FIG. 5 can be enlarged. In this case, the detection range of the level-crossing timing can be increased. However, the detection resolution is decreased.

A variable delay circuit may be provided in each transmission path providing the clock to the comparators 112. The measurement apparatus 100 may control the variable delay circuits in order to increase the cross-skew scattering for stochastic samplers 110 in which the slope of the input signal at the corresponding reference level is low and decrease the clock skew dispersion for stochastic samplers 110 in which the slope of the input signal at the corresponding reference level is high.

Figure 11:
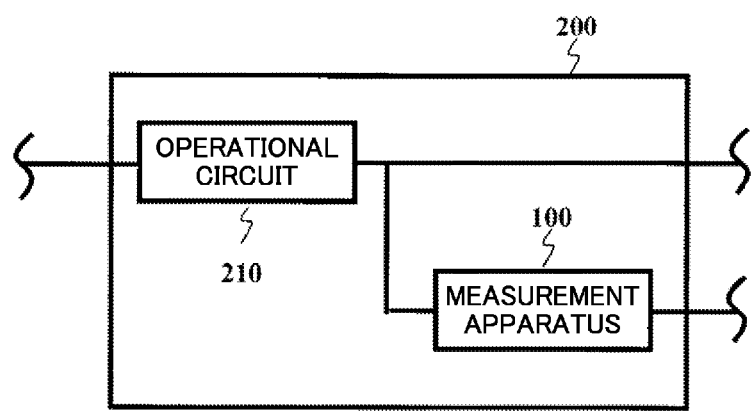
FIG. 11 shows an exemplary configuration of the electronic device 200.

FIG. 11 shows an exemplary configuration of an electronic device 200. The electronic device 200 includes an operational circuit 210 and the measurement apparatus 100. The measurement apparatus 100 is the same as the measurement apparatus 100 described in FIGS. 1 to 10B.

The operational circuit 210 operates according to a signal or the like supplied from the outside, and outputs a signal. The measurement apparatus 100 measures the signal output by the operational circuit 210. The measurement apparatus 100 may output digitized data of the signal to the outside of the electronic device 200. The operational circuit 210 may be a semiconductor circuit, such as an IC or a memory.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures an input signal, comprising: a plurality of first comparators that each receive the input signal, and that each have a common first reference level set therein, wherein each of the plurality of first comparators compares a signal level of the input signal to the first reference level; and a level-crossing timing detecting section that detects a level-crossing timing at which the signal level crosses the first reference level, based on comparison results of the outputs of the first comparators.

2. The measurement apparatus according to claim 1, wherein
each first comparator outputs, as the comparison result, a logic value indicating which of the first reference level and the signal level of the input signal is greater, and
the level-crossing timing detecting section detects a timing at which a ratio of comparison results that indicate a predetermined logic value, from among the comparison results of the first comparators, matches a predetermined reference ratio.

3. The measurement apparatus according to claim 2, wherein
the level-crossing timing detecting section detects a timing of the reference ratio by performing an interpolation using ratios detected at two timings that sandwich the timing at which the reference ratio is realized.

4. The measurement apparatus according to claim 3, wherein
the level-crossing timing detecting section sets a range of a linear region corresponding to each of the reference levels.

5. The measurement apparatus according to claim 1, further comprising a plurality of second comparators that each receive the input signal, and that each have a common second reference level set therein, wherein each of the plurality of second comparators compares the signal level of the input signal to the second reference level, and wherein the level-crossing timing detecting section further detects a level-crossing timing at which the signal level crosses the second reference level, based on comparison results of the outputs of the second comparators.

6. The measurement apparatus according to claim 5, further comprising a voltage sampler that detects the signal level of the input signal by comparing the signal level of the input signal to a reference signal level that is greater than the first and second reference levels or to a reference signal level that is less than the first and second reference levels.

7. The measurement apparatus according to claim 5, further comprising a digitizing section that digitizes a waveform of the input signal based on each reference level and timings at which the input signal level crosses each of the reference levels.

8. An electronic device comprising the measurement apparatus according to claim 1.

* * * * *